(12) United States Patent
Taura (10) Patent No.: US 8,363,139 B2
(45) Date of Patent: Jan. 29, 2013

(54) IMAGING DEVICE HAVING HIERARCHICAL BUSES

(75) Inventor: Tadayuki Taura, Kanagawa (JP)

(73) Assignee: Sony Corporation, Tokyo (JP)

( * ) Notice: Subject to any disclaimer, the term of this patent is extended or adjusted under 35 U.S.C. 154(b) by 484 days.

(21) Appl. No.: 12/080,689

(22) Filed: Apr. 4, 2008

(65) Prior Publication Data

US 2008/0273107 A1  Nov. 6, 2008

(30) Foreign Application Priority Data

May 2, 2007  (JP) ................. P2007-121408

(51) Int. Cl.
*H04N 3/14* (2006.01)
*H04N 5/335* (2011.01)
*H01L 27/00* (2006.01)
*H01L 31/062* (2012.01)
*H01L 31/113* (2006.01)

(52) U.S. Cl. ............. 348/308; 250/208.1; 257/292

(58) Field of Classification Search .................... None
See application file for complete search history.

(56) References Cited

U.S. PATENT DOCUMENTS

| | | | | |
|---|---|---|---|---|
| 6,831,690 B1 * | 12/2004 | John et al. ............... | 348/302 |
| 7,075,474 B2 * | 7/2006 | Yamagata et al. ........ | 341/169 |
| 7,129,883 B2 * | 10/2006 | Muramatsu et al. ..... | 341/164 |
| 7,145,494 B2 * | 12/2006 | Mizuguchi et al. ...... | 341/155 |
| 7,511,754 B2 * | 3/2009 | Scott-Thomas et al. .. | 348/302 |
| 7,522,199 B2 * | 4/2009 | Funakoshi et al. ...... | 348/245 |
| 7,570,293 B2 * | 8/2009 | Nakamura .............. | 348/308 |
| 7,659,925 B2 * | 2/2010 | Krymski ................. | 348/222.1 |
| 7,876,362 B2 * | 1/2011 | Krymski ................. | 348/222.1 |

FOREIGN PATENT DOCUMENTS

| | | |
|---|---|---|
| JP | 2006-270293 | 10/2006 |
| JP | 2007-080302 | 3/2007 |

OTHER PUBLICATIONS

W. Yang et al., "An Integrated 800×600 CMOS Image Sistem", ISSCC Digest of Technical Papers, pp. 304-305, Feb. 1999.

* cited by examiner

Primary Examiner — Justin P Misleh
(74) Attorney, Agent, or Firm — Robert J. Depke; Rockey, Depke & Lyons, LLC (57) ABSTRACT

A data transfer circuit includes at least one transfer line transferring digital data, at least one data detecting circuit connecting to the transfer line, multiple holding circuits holding a digital value corresponding to the input level and transferring the digital value to the transfer line, and a scanning circuit selecting the multiple holding circuits, wherein the multiple holding circuits are laid out in parallel, and the transfer line is placed in the direction orthogonal to the direction of the parallel layout of the holding circuit and connects to the data detecting circuit placed in the orthogonal direction.

14 Claims, 10 Drawing Sheets

IMAGING DEVICE HAVING HIERARCHICAL BUSES

CROSS REFERENCES TO RELATED APPLICATIONS

The present invention contains subject matter related to Japanese Patent Application JP 2007-121408 filed in the Japanese Patent Office on May 2, 2007, the entire contents of which being incorporated herein by reference.

BACKGROUND OF THE INVENTION

1. Field of the Invention

The present invention relates to a data transfer circuit, a solid-state imaging device typically such as a CMOS image sensor and a camera system and, in particular, to a solid-state imaging device and camera system that include a column parallel analog-digital converter.

2. Description of the Related Art

A CMOS image sensor having a column parallel analog-digital converter (which will be abbreviated to ADC hereinafter) is proposed in W. Yang et al., "An Integrated 800×600 CMOS Image System," ISSCC Digest of Technical Papers, pp. 304-305, February 1999 (Non-Patent Document 1).

Figure 1:
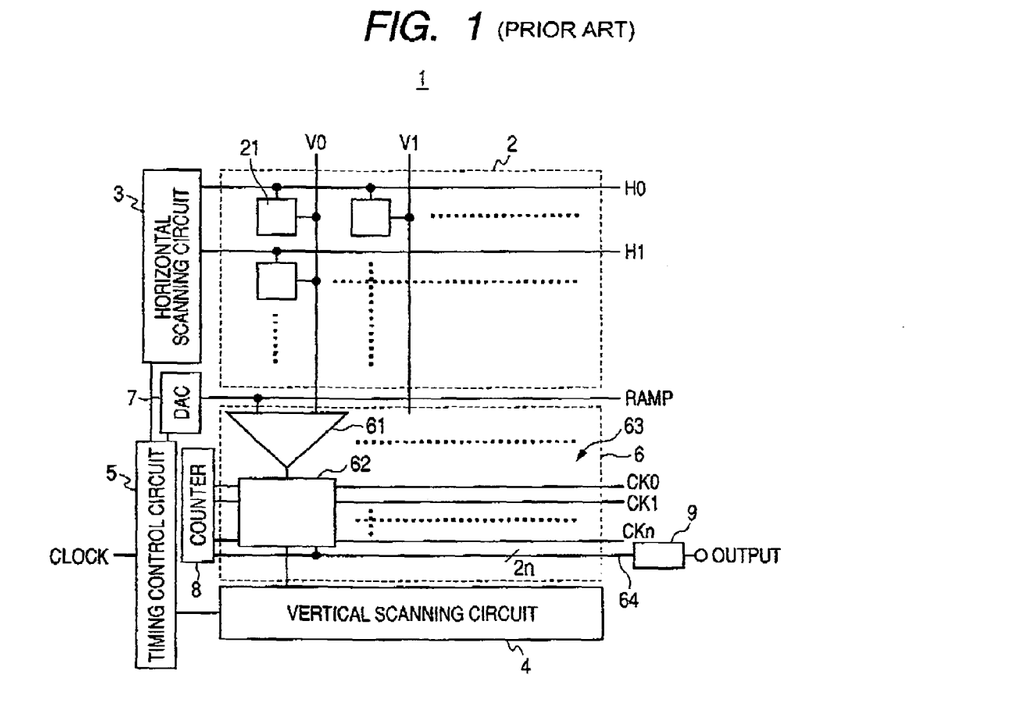
FIG. 1 is a block diagram showing a configuration example of a solid-state imaging device (CMOS image sensor) having a column parallel ADC.

FIG. 1 is a block diagram showing a configuration example of a solid-state imaging device (CMOS image sensor) having a column parallel ADC.

The solid-state imaging device 1 includes a pixel array section 2 functioning as an imaging section, a horizontal scanning circuit 3, a vertical scanning circuit 4, a timing control circuit 5, an ADC group 6, a digital-analog converter (which will be abbreviated to DAC, hereinafter) 7, a counter 8 and a subtracting circuit 9.

The pixel array section 2 has unit pixels 21 laid out in a matrix form. Each of the unit pixels 21 contains a photodiode and an in-pixel amplifier.

In the solid-state imaging device 1, the timing control circuit 5 that generates internal clocks, the horizontal scanning circuit 3 that controls row addresses and/or horizontal scanning and the vertical scanning circuit 4 that controls column addresses and/or vertical scanning are deployed as control circuits for sequentially reading out signals of the pixel array section 2.

The ADC group 6 has an array of multiple ADCs each having a comparator 61 and a memory 62. The comparator 61 compares a ramp waveform RAMP resulting from changing a reference voltage generated by the DAC 7 to have a step shape and analog signals obtained from the unit pixels 21 on the horizontal lines H0, H1 and so on through the vertical lines V0, V1 and so on. The memory device 62 holds the result of counting by the counter 8 that counts the comparison time.

The ADC group 6 has an n-bit-digital signal conversion function and is provided for each of the vertical lines V0, V1 and so on in a column parallel ADC block 63.

The output of the memory devices 62 connects to a horizontal transfer line 64 in a 2-bit width.

Then, 2n sense circuits corresponding to the horizontal transfer lines 64, the subtracting circuit 9 and an output circuit are provided therein.

Figure 2:
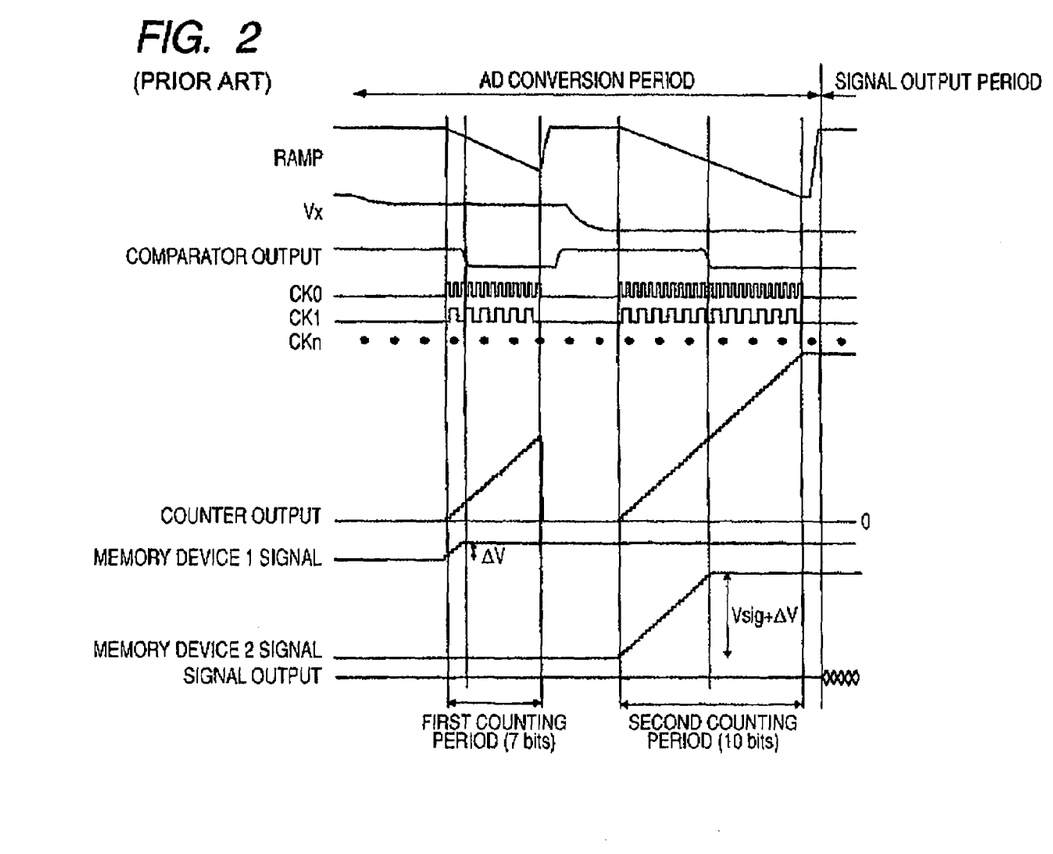
FIG. 2 is a timing chart for explaining operations by the solid-state imaging device in FIG. 1.

Now, operations by the solid-state imaging device (CMOS image sensor) 1 will be described in relation with the timing chart in FIG. 2 and the block diagram in FIG. 1.

After the first readout from the unit pixels 21 on an arbitrary row Hx to the vertical lines V0, V1 and so on becomes stable, a step-shaped ramp waveform RAMP in which a reference voltage is changed over time is input to the comparator 61 by the DAC 7, and the comparison with the voltage of an arbitrary vertical line Vx is performed in the comparator 61.

In parallel with the input of the step-shaped waves of the ramp waveform RAMP, the counter 8 performs the first counting.

Here, the output of the comparator 61 is inverted when the voltages of the RAMP and the Vx are equal, and, at the same time, the count based on the comparison period is held in the memory device 62. The first readout reads out a reset component $\Delta V$ of the unit pixel 21, and the reset component $\Delta V$ internally contains noise that varies among the unit pixels 21 as an offset.

However, the variation of the reset component $\Delta V$ is generally small, and the reset level is common in all pixels. Therefore the output of an arbitrary vertical line Vx is almost known.

For that reason, the comparison period can be reduced by adjusting the ramp waveform (RAMP) voltage upon the first readout of the reset component $\Delta V$. In this example, the $\Delta V$ comparison is performed in a count period for seven bits (which is equal to 128 clocks).

The second readout reads out a signal component corresponding to the quantity of incident light for each of the unit pixels 21 in addition to the reset component $\Delta V$ and performs the same operation as that of the first readout.

That is, after the second readout from the unit pixels 21 on an arbitrary row Hx to the vertical lines V0, V1 and so on becomes stable, a step-shaped ramp waveform RAMP in which the reference voltage is changed over time is input to the comparator 61 by the DAC 7, and the comparison with the voltage of an arbitrary vertical line Vx is performed in the comparator 61.

In parallel with the input of the step-shaped waves of the ramp waveform RAMP, the counter 8 performs the second counting.

Here, the output of the comparator 61 is inverted when the voltages of the RAMP and the Vx are equal, and, at the same time, the count based on the comparison period is held in the memory device 62.

At that time, the first count and the second count are held at different places within the memory device 62.

After the completion of the AD conversion period above, the first and second n-bit digital signals held in the memory device 62 by the vertical scanning circuit 4 undergo the processing of (second signal)-(first signal) sequentially in the sense circuit and subtracting circuit 9 through the 2n horizontal transfer lines 64. After that, the same operation is performed for each row sequentially, and a two-dimensional image is created.

SUMMARY OF THE INVENTION

However, the horizontal transfer line in a solid-state imaging device (CMOS image sensor) as described above is significantly long and may have a length of about 7 mm, and the detection time varies between the sides near and far away from the sense circuit due to the parasitic capacitance and/or resistance.

As a result, it is important to tune the sense circuit to allow the variations, which disadvantageously complicates the circuit design.

There is also a problem of mixing of digital noise from the memory device, which is a digital circuit.

Accordingly, it is desirable to provide a data transfer circuit, solid-state imaging device and camera system, which can reduce the parasitic capacitance and/or parasitic resistance on a transfer line to a data detecting circuit and can increase the speed of the data transfer to the data detecting circuit.

According to an embodiment of the present invention, there is provided a data transfer circuit including at least one transfer line transferring digital data, at least one data detecting circuit connecting to the transfer line, multiple holding circuits holding a digital value corresponding to the input level and transferring the digital value to the transfer line, and a scanning circuit selecting the multiple holding circuits, wherein the multiple holding circuits are laid out in parallel, and the transfer line is placed in the direction orthogonal to the direction of the parallel layout of the holding circuit and connects to the data detecting circuit placed in the orthogonal direction.

According to another embodiment of the invention, there is provided a solid-state imaging device including an imaging section in which multiple pixels performing photoelectric conversion are laid out in a matrix form, at least one transfer line transferring digital data, at least one data detecting circuit connecting to the transfer line, multiple holding circuits holding a digital value corresponding to the analog input level read out through a vertical line of the imaging section and transferring the digital value to the transfer line, and a scanning circuit selecting the multiple holding circuits, wherein the multiple holding circuits are laid out in parallel, and the transfer line is placed in the direction orthogonal to the direction of the parallel layout of the holding circuit and connects to the data detecting circuit placed in the orthogonal direction.

Preferably, multiple scanning circuits and transfer lines are grouped, and the data detecting circuit is placed for each of the groups.

Preferably, the data transfer circuit further includes a main transfer line connecting to the output of the data detecting circuit, and a main data detecting circuit connecting to the main transfer line.

Preferably, the main transfer line is placed in the direction of the parallel layout of the holding circuits and connects to the main data detecting circuit placed in the direction.

According to another embodiment of the invention, there is provided a camera system including a solid-state imaging device., an optical system forming a subject image on the imaging device, and a signal processing circuit processing an output image signal of the imaging device, the solid-state imaging device having an imaging section in which multiple pixels performing photoelectric conversion are laid out in a matrix form, at least one transfer line transferring digital data, at least one data detecting circuit connecting to the transfer line, multiple holding circuits holding a digital value corresponding to the analog input level read out through a vertical line of the imaging section and transferring the digital value to the transfer line, and a scanning circuit selecting the multiple holding circuits, wherein the multiple holding circuits are laid out in parallel, and the transfer line is placed in the direction orthogonal to the direction of the parallel layout of the holding circuits and connects to the data detecting circuit placed in the orthogonal direction.

According to the embodiments of the invention, the parasitic capacitance and/or parasitic resistance on a transfer line to a data detecting circuit can be reduced.

Therefore, the speed of the data transfer to the data detecting circuit can be increased.

DESCRIPTION OF THE PREFERRED EMBODIMENTS

In relation to drawings, embodiments of the invention will be described below.

Figure 3:
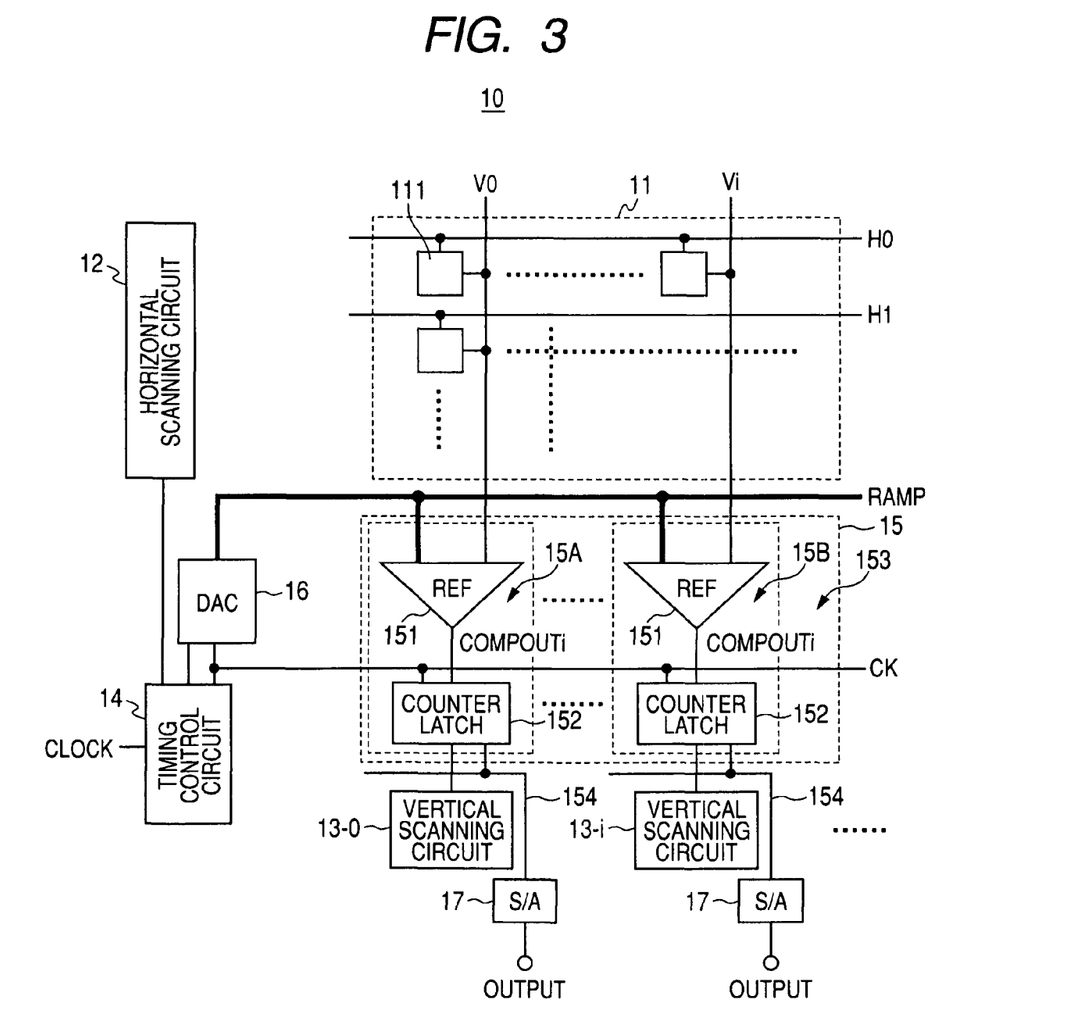
FIG. 3 is a block diagram showing a configuration example of a solid-state imaging element (CMOS image sensor) having a column parallel ADC according to an embodiment of the invention.
Figure 4:
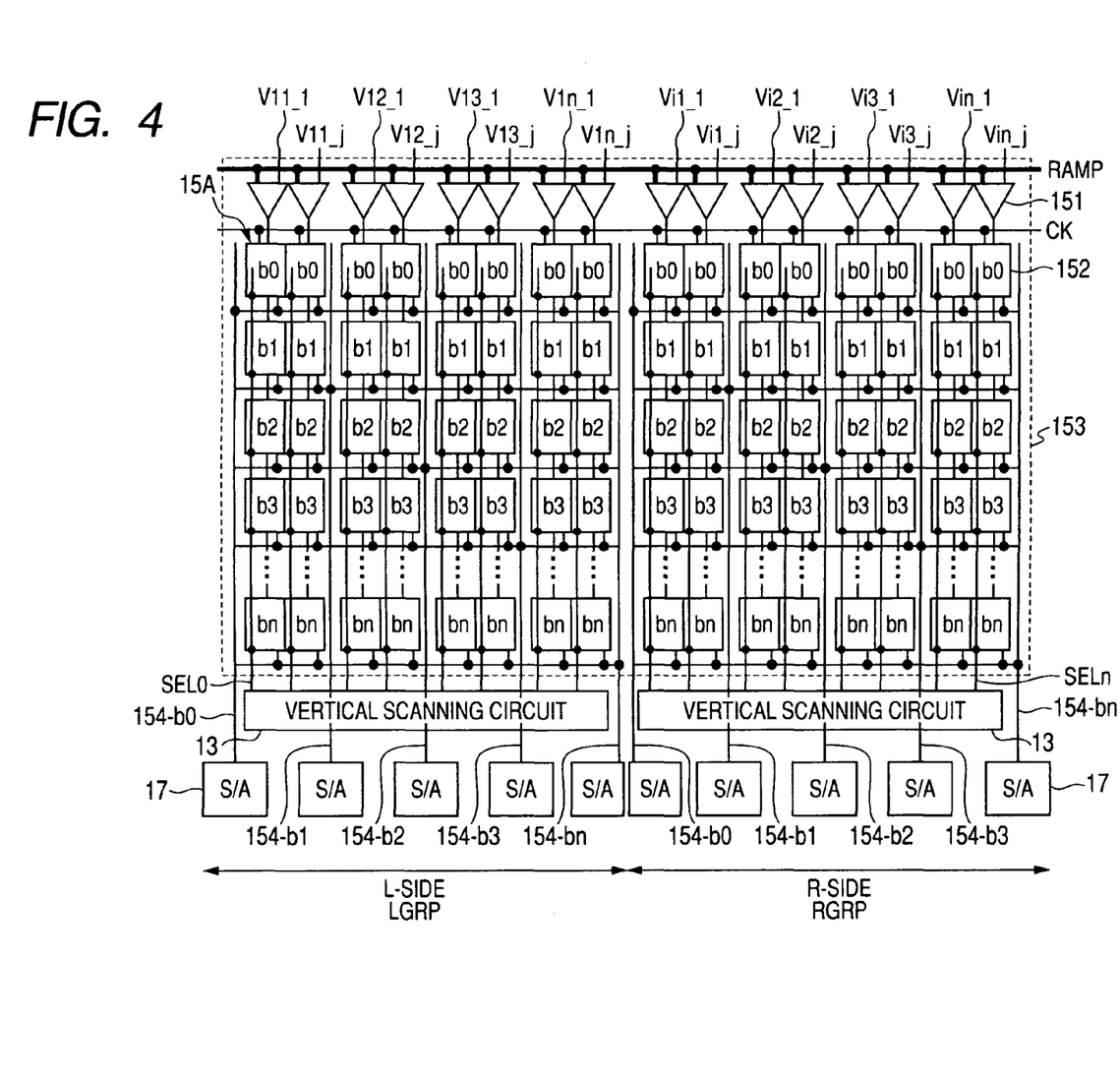
FIG. 4 is a diagram showing a more specific configuration example of a data transfer system of the ADC and solid-state imaging device in FIG. 3.

FIG. 3 is a block diagram showing a configuration example of a solid-state imaging device (CMOS image sensor) having a column parallel ADC, which includes a data transfer circuit according to an embodiment of the invention. FIG. 4 is a diagram showing a more specific configuration example of a data transfer system of the ADC and sold-state imaging device in FIG. 3.

A solid-state imaging device 10 has a pixel array section 11 functioning as an imaging section, a horizontal scanning circuit 12, a vertical scanning circuit 13 (-0 to -i to -n), a timing control circuit 14, an ADC group 15, a DAC 16 and multiple sense amplifiers (S/A) circuits 17, which function as a data detecting circuit.

The pixel array section 11 has unit pixels ill each containing a photodiode and an in-pixel amplifier. The unit-pixels 111 are laid out in a matrix form of M rows by N columns.

The solid-state imaging device 10 includes the timing control circuit 14 that generates internal clocks, the horizontal scanning circuit 12 that controls row addresses and horizontal scanning and vertical scanning circuit 13 that controls column addresses and vertical scanning. The solid-state imaging device 10 functions as a control circuit for sequentially reading out signals of the pixel array section 11.

The ADC group 15 includes a column parallel ADC block 153 in which each of (n+1) ADCs 15A is provided for each of vertical lines V0, V1 and so on for the columns of a pixel array. Each of the ADC 15A includes a comparator 151 and an asynchronous up/down counter (counter latch) 152. Each of the comparators 151 is provided for each column of the pixel array and compares a ramp waveform RAMP resulting from the change of a reference voltage generated by the DAC 16 to have a step shape and an analog signal obtained from the unit pixel ill for each of the horizontal lines H0, H1 and so on through the vertical lines V0, V1 and so on. Each of the asynchronous up/down counters 152 performs up/down counting in response to the output of the corresponding comparator 151.

The output of each of the counter latches 152 connects to a data transfer line 154 in a width of l+1 bits, for example. The data transfer line 154 connects to the input of the corresponding sense amplifier circuit 17.

The counter latch 152 functioning as a holding circuit initially has a down counting state. When reset counting is performed thereon, and the output COMPOUTi of the corresponding comparator 151 is inverted, the counter latch 152 stops the down counting operation and holds the count value.

At that time, the initial value of the counter latch 152 may be an arbitrary value of the levels of AD conversion, such as zero (0). During the reset counting period, the counter latch 152 reads out a reset component ΔV of the unit pixel 111.

The counter latch 152 after that enters to the up counting state and performs data counting corresponding to the quantity of incident light. When the output COMPOUTi of the corresponding comparator 151 is inverted, the counter latch 152 holds the count value corresponding to the comparison period.

The count value held in the counter latch 152 is scanned by the vertical scanning circuit 13 and is input as a digital signal to the sense amplifier circuit 17 through the transfer line 154.

The vertical scanning circuit 13-0 may be activated in response to the supply of a start pulse, for example.

After that, adjacent vertical scanning circuits 13-1 to 13-n are sequentially selected.

Now, in relation to FIG. 4, a more specific configuration example of the data transfer system of the ADC and solid-state imaging device in FIG. 3 will be described.

The counter latch 152 includes, for example, an array of counter CNT/latch LTC/Drive DRV transistors (Tr), each of which is provided for one bit (or for 10 bits or 12 bits, for example). In addition, (n+1) columns of ADCs 15A are aligned.

During data transfer, specific columns are sequentially selected by the vertical scanning circuits 13-0 to 13-n through select lines SEL0 to SELn.

The starting position for each of the vertical scanning circuits 13-0 to 13-n is selected by a start pulse, and the vertical scanning circuits 13-0 to 13-n are sequentially selected through shift registers.

The information (1 or 0) of the drive transistor Tr at the selected column is read out and output by the sense amplifier circuit 17, which is the data detecting circuit.

Figure 5:
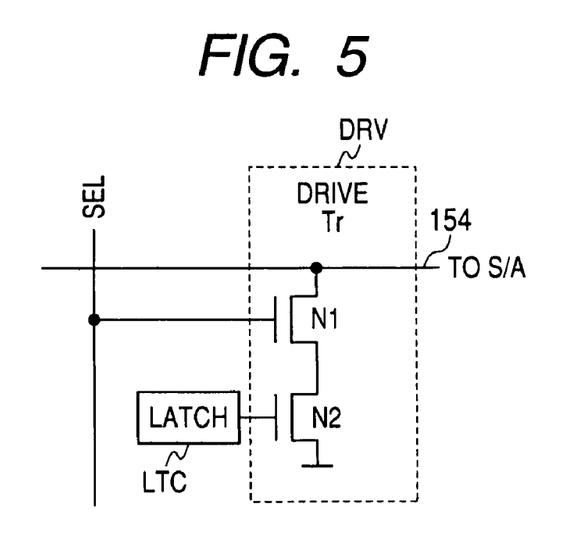
FIG. 5 is a circuit diagram showing a specific example of a drive transistor Tr within a counter latch circuit according to the embodiment of the invention.

FIG. 5 is a circuit diagram showing a specific example of the drive transistor (drive Tr hereinafter) within the counter latch circuit according to this embodiment.

As shown in FIG. 5, the drive transistor DRVtr includes a select transistor N1 and a data transistor N2, which are directly connected between a predetermined potential and the data transfer line 154. The select transistor N1 may be formed from an n-channel MOS (NMOS) transistor. The data transistor N2 may be formed from an NMOS transistor. Then, the gate of the select transistor N1 connects to a select line SEL to be driven by the vertical scanning circuit 13 (-0 to n), and the gate of the data transistor N2 connects to the output of the latch LTC.

The connection to the data transfer line (S/A bus) 154 is implemented by the SEL to be driven by the output of the vertical scanning circuit 13, and the state of the transistor N2 depending on the latch data is read out from the sense amplifier circuit 17, which is the data detecting circuit.

If the latch data is 1, the current path is provided through which current flows. If the latch data is 0, the current path is shut down, which prevents the current flow.

Figure 6:
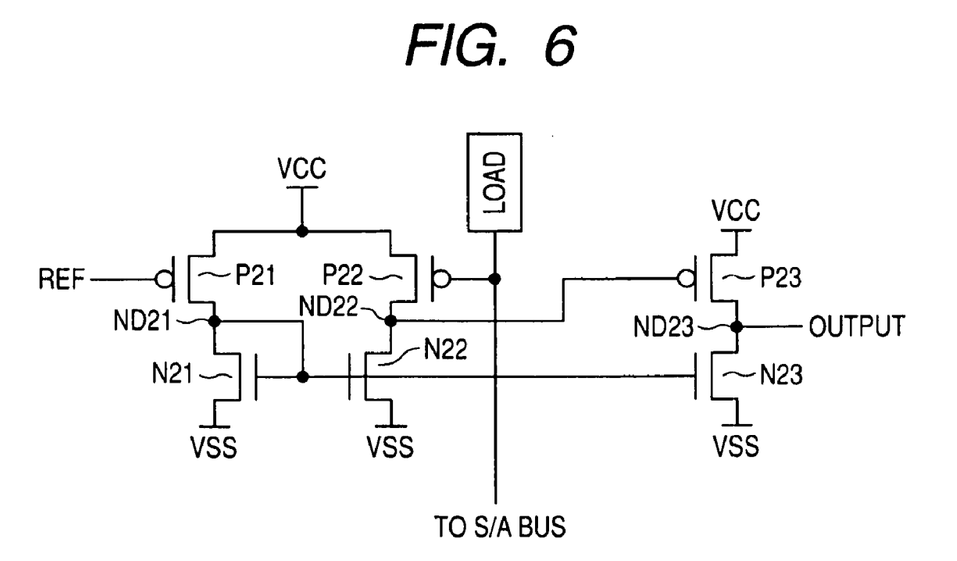
FIG. 6 is a circuit diagram showing a specific example of a sense amplifier circuit according to the embodiment of the invention.

FIG. 6 is a circuit diagram showing a specific example of the sense amplifier circuit according to this embodiment.

The sense amplifier circuit 17 includes transistors P21 to P23 each containing a p-channel MOS (PMOS) transistor and transistors N21 to N23 each containing an n-channel MOS (NMOS) transistor.

The sources of the transistors P21 to P23 connect to a power supply potential VCC, and the sources of the transistors N21 to N23 connect to a reference potential VSS.

The drain of the transistor P21 and the drain of the transistor N21 are connected, and a connection node ND21 therebetween connects to the gates of the transistors N21 and N22.

The drain of the transistor P22 and the drain of the transistor N22 are connected, and a connection node ND22 therebetween connects to the gate of the transistor P23.

The drain of the transistor 23 and the drain of the transistor N23 are connected, and an output node ND23 has the connection point.

Then, in this circuit, LOAD functions as a constant-current source, which biases the S/A bus, and the supply line connects to the gate of the transistor P22.

Multiple drive Trs connect to the S/A bus, and the level of the S/A bus is driven to the H-state or L-state based on the data of the selected drive Tr.

The final output is determined based on the comparison result between the level and a reference voltage REF functioning as a reference.

The REF side is also configurable to perform a differential operation, like the configuration as the S/A bus. In this case, the drive Trs may be transistors of opposite phase.

Then, as shown in FIG. 4, according to this embodiment, the data transfer lines (bus) 154 are laid out in the vertical direction (or longitudinal direction in FIG. 4), that is, in the direction of wiring of the vertical line Vx. Thus, the data transfer buses can be divided, which can reduce the parasitic resistance and/or parasitic capacitance. In other words, hierarchical sense amplifier buses can reduce the parasitic resistance and/or parasitic capacitance.

According to this embodiment, the vertical scanning circuits 13, the data transfer lines 154 and sense amplifier circuits 17 are divided and grouped for each several hundred columns or several thousand columns, which allows the configuration in which a sensing operation can be performed in parallel.

In the same manner, the column parallel ADC block 153 may be divided into multiple blocks each containing several hundred or several thousand columns.

The output of the synchronous up/down counter 152 connects to (n+1) data transfer lines 154, and an operation of reading out data of the column selected by the vertical scanning circuit 13 is performed by the sense amplifier circuit 17.

The ADCs 15A are generally placed at equal pitches, such as 2 μm, to those of the unit pixels 111.

According to this embodiment, however, the placement of the ADCs 15A at slightly narrower pitches than those of the unit pixels 111 can provide a space for extending the data transfer lines 154.

This provides the effect of reducing the parasitic resistance and/or parasitic capacitance on the data transfer lines, and an increase in number of the block divisions can increase the reduction effect.

Next, the positions of the sense amplifier circuits on the layout in the solid-state imaging device will be considered.

Figure 7:
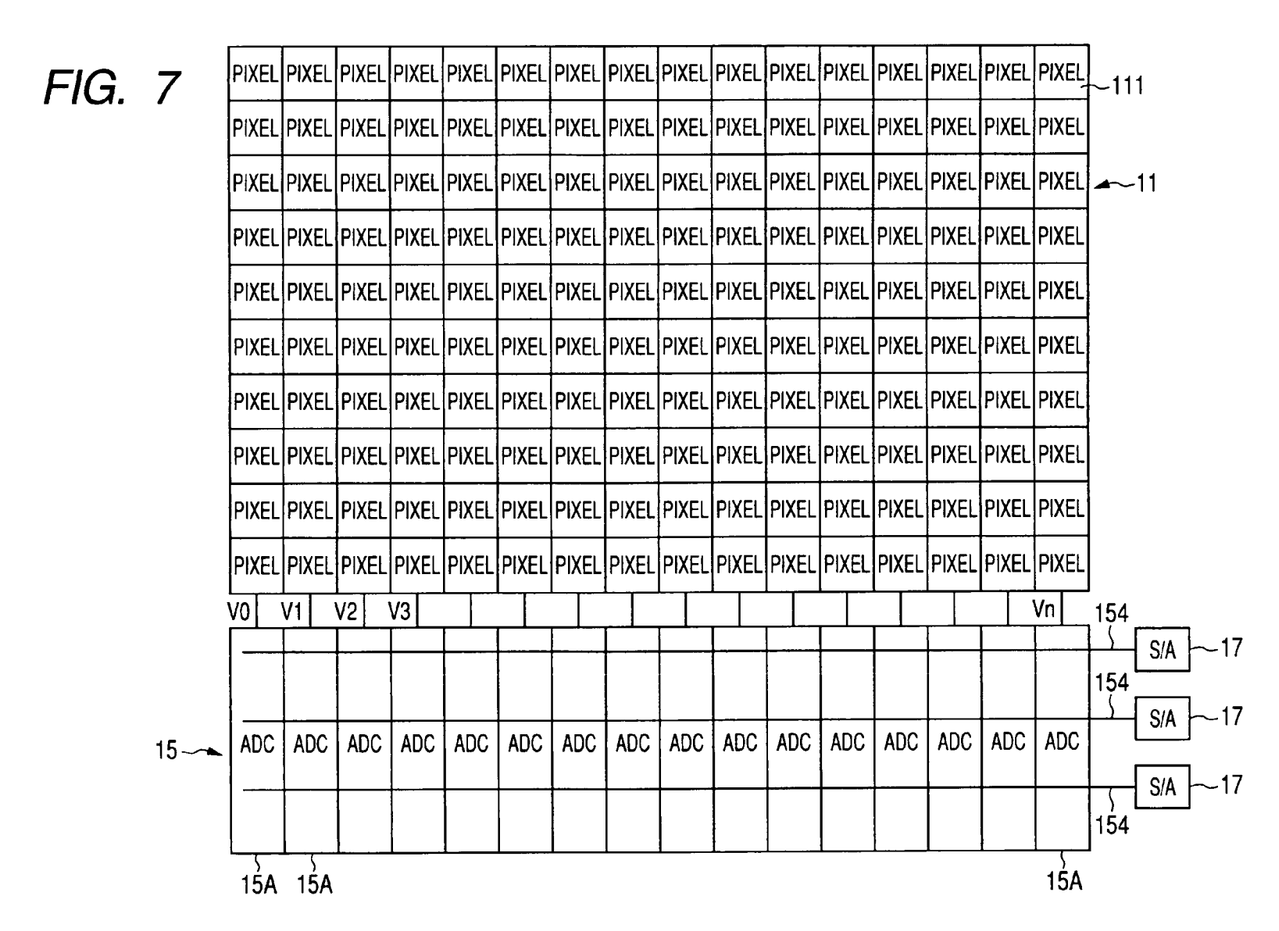
FIG. 7 is a diagram showing a layout image of pixels, ADC and sense amplifier (S/A) circuits for a general solid-state imaging device.

FIG. 7 is a diagram showing a layout image of pixels, ADCs and sense amplifiers (S/A) circuits for a general solid-state imaging device.

Figure 8:
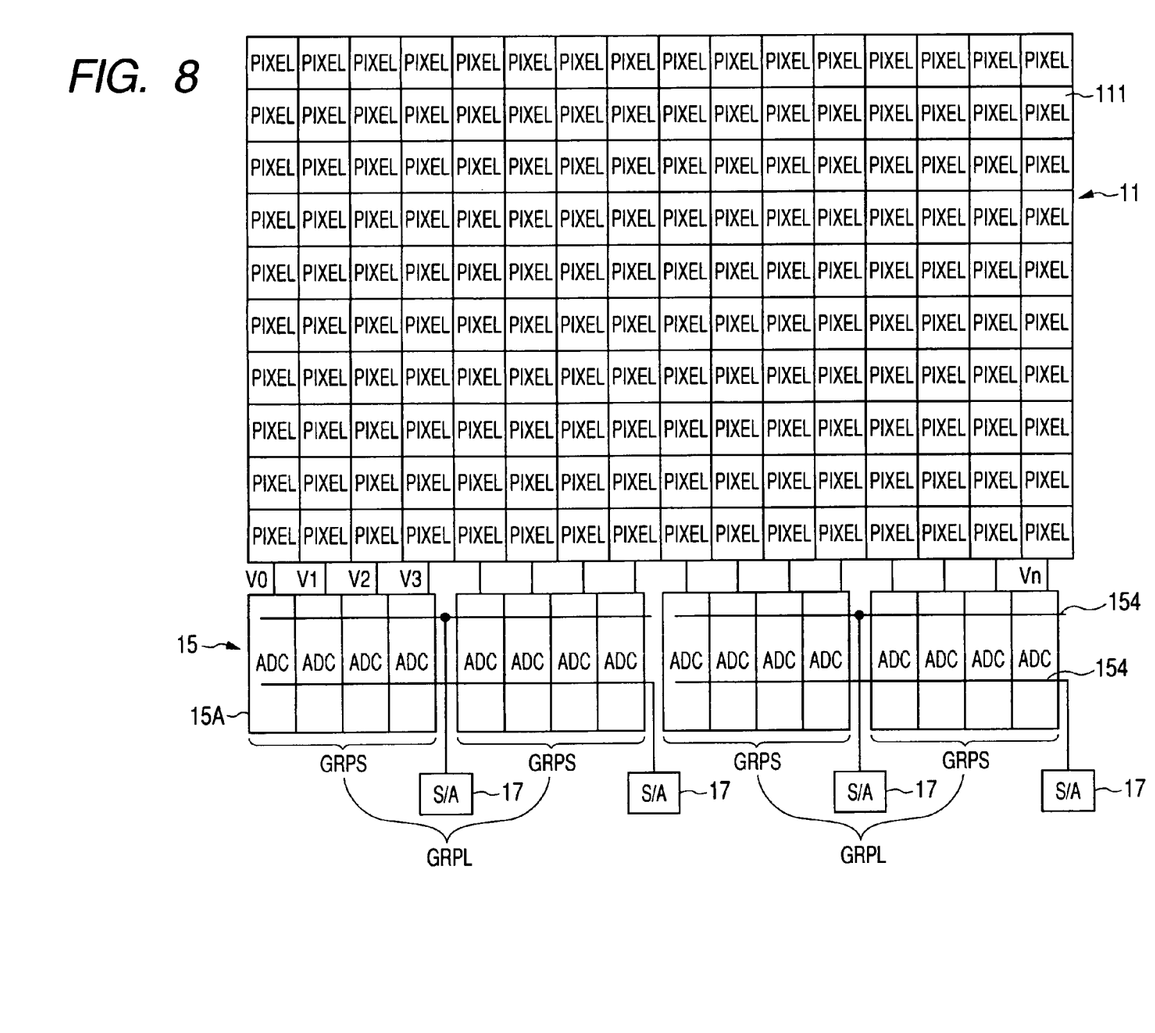
FIG. 8 is a diagram showing a layout image of the pixels, ADC and sense amplifier (S/A) circuits for the solid-state imaging device in FIG. 3.

FIG. 8 is a diagram showing a layout image of pixels, ADCs and sense amplifiers (S/A) circuits for the solid-state imaging device in FIG. 3.

In a CMOS sensor, it is important to lay out pixels in one array. In a memory, pixels may be divided properly because of no limit on the physical positions.

The pixels may be laid out at significantly fine pitches such as around 2 to 3 μm as described above, while depending on the unit pixel size.

For that reason, it is important to layout the ADCs 15A of the ADC group 15 based on the pitch.

In particular, the layout of the comparators 151 based on the pixel pitch is important for suppressing the variations in characteristics since the uniformity of the layout is important for preventing the uneven characteristics.

As a result, as shown in FIG. 7, the data transfer lines (buses) connecting to the sense amplifier circuits 17 functioning as the data detecting circuits are laid out across the ADCs 15A.

The length of each of the data transfer lines (buses) in this case may extend about 7 mm, for example, which is subject to significantly large parasitic resistance and/or parasitic capacitance.

This may be a factor in delay of the readout time (data detection time).

Accordingly, according to this embodiment, as shown in FIG. 4, the data transfer buses are laid out (extended) in the vertical direction (or longitudinal direction in FIG. 4), that is, in the direction of wiring of the vertical lines Vx in the clearance such that the data transfer buses can be divided, which can reduce the parasitic resistance and/or parasitic capacitance. In other words, the hierarchical sense amplifier buses allow reduction of parasitic resistance and/or parasitic capacitance.

As a result, the readout time can be reduced.

Furthermore, allowing parallel processing therein can increase the speed more.

In this case, multiple ADCs 15A are grouped into a small group GRPS, and a large group GPRL includes multiple small groups. The sense amplifier circuit 17 is deployed for each of the small groups GRPSs and large groups GRPLS.

However, the pitch is preferably equal to the pixel pitch up to the comparator 151, which is an analog circuit, and is narrowed from the digitized counter unit.

The division of the data transfer lines (buses) also allows partial readout (activation). In other words, so-called window extraction is allowed.

In the example in FIG. 4, two groups of multiple ADCs 15A are formed, and hierarchical sense amplifier buses in bits are deployed to the two groups, that is, the left group LGRP and the right group RGRP.

Figure 9:
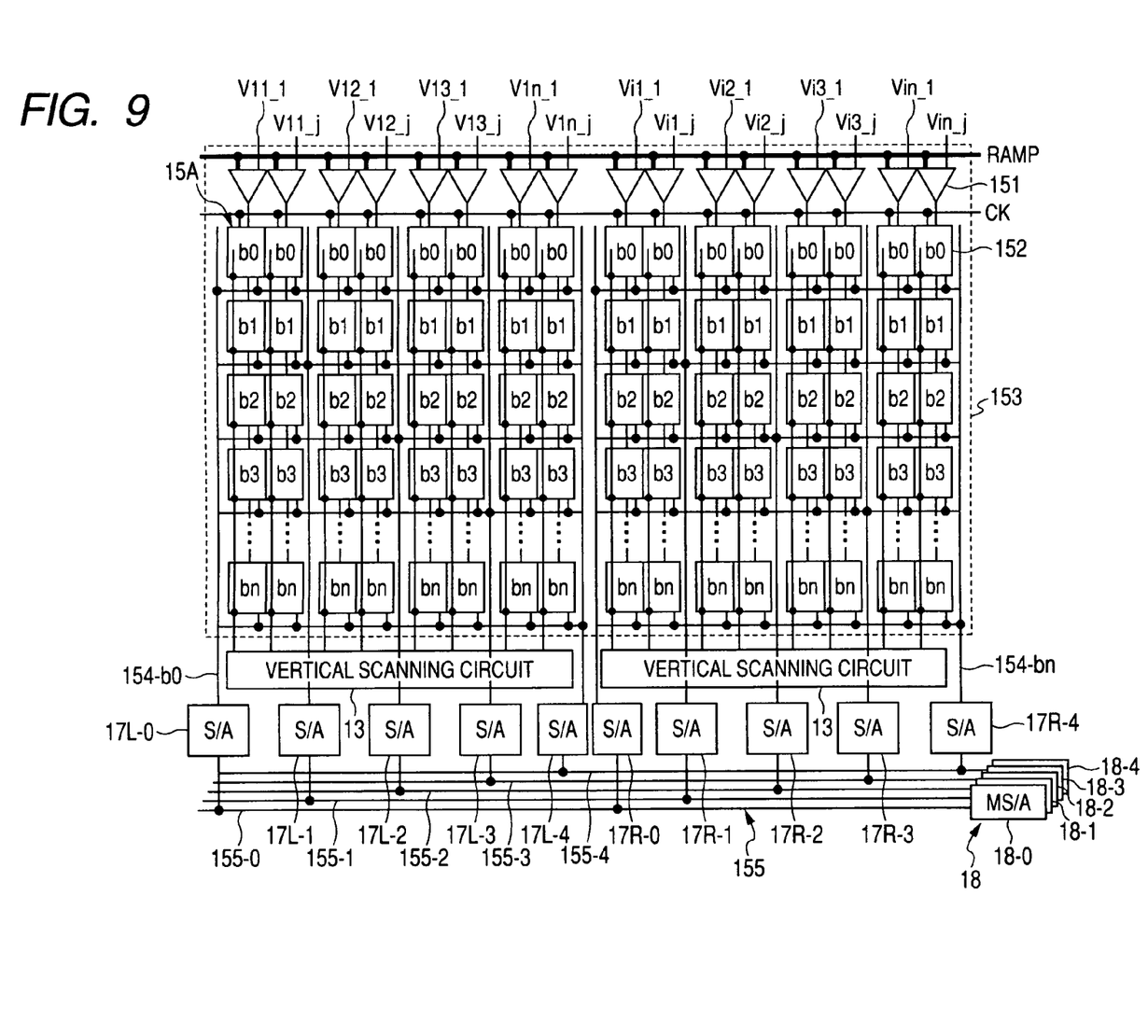
FIG. 9 is a diagram showing another configuration example of the data transfer system of the ADC and solid-state imaging device in FIG. 3.

FIG. 9 is a diagram showing another configuration example of the data transfer system of the ADCs and solid-state imaging device in FIG. 3.

The configuration in FIG. 9 further includes main data transfer lines 155 and a main sense amplifier circuit (MS/A) 18 in addition to the configuration in FIG. 4.

The main data transfer line connects to the outputs of the sense amplifier circuits 17, and one end thereof connects to the main sense amplifier circuit 18.

The main data transfer lines 155 are laid out in the direction of wiring of the ADCs 15A of the column parallel ADC block 153, and the main sense amplifier circuit 18 is laid out at the end in the direction.

In the configuration example in FIG. 9, the output of a sense amplifier circuit 17L-0 of the left group LGRP and the output of a sense amplifier circuit 17R-0 of the right group RGRP commonly connect to a main data transfer line 155-0, and the main data transfer line 155-0 connects to the input of a main sense amplifier circuit 18-0.

In the same manner, the output of a sense amplifier circuit 17L-1 of the left group LGRP and the output of a sense amplifier circuit 17R-1 of the right group RGRP commonly connect to a main data transfer line 155-1, and the main data transfer line 155-1 connects to the input of a main sense amplifier circuit 18-1.

The output of a sense amplifier circuit 17L-2 of the left group LGRP and the output of a sense amplifier circuit 17R-2 of the right group RGRP commonly connect to a main data transfer line 155-2, and the main data transfer line 155-2 connects to the input of a main sense amplifier circuit 18-2.

The output of a sense amplifier circuit 17L-3 of the left group LGRP and the output of a sense amplifier circuit 17R-3 of the right group RGRP commonly connect to a main data transfer line 155-3, and the main data transfer line 155-3 connects to the input of a main sense amplifier circuit 18-3.

The output of a sense amplifier circuit 17L-4 of the left group LGRP and the output of a sense amplifier circuit 17R-4 of the right group RGRP commonly connect to a main data transfer line 155-4, and the main data transfer line 155-4 connects to the input of a main sense amplifier circuit 18-4.

In this configuration, the sense amplifier circuit 17 reads predetermined data through the data transfer line 154 and then selectively drives the main data transfer line 155.

Then, data is received by the main sense amplifier circuit 18.

This configuration allows fast data readout by the main sense amplifier circuit 18, also allowing a slower operation by the sense amplifier circuit 17.

Figure 10:
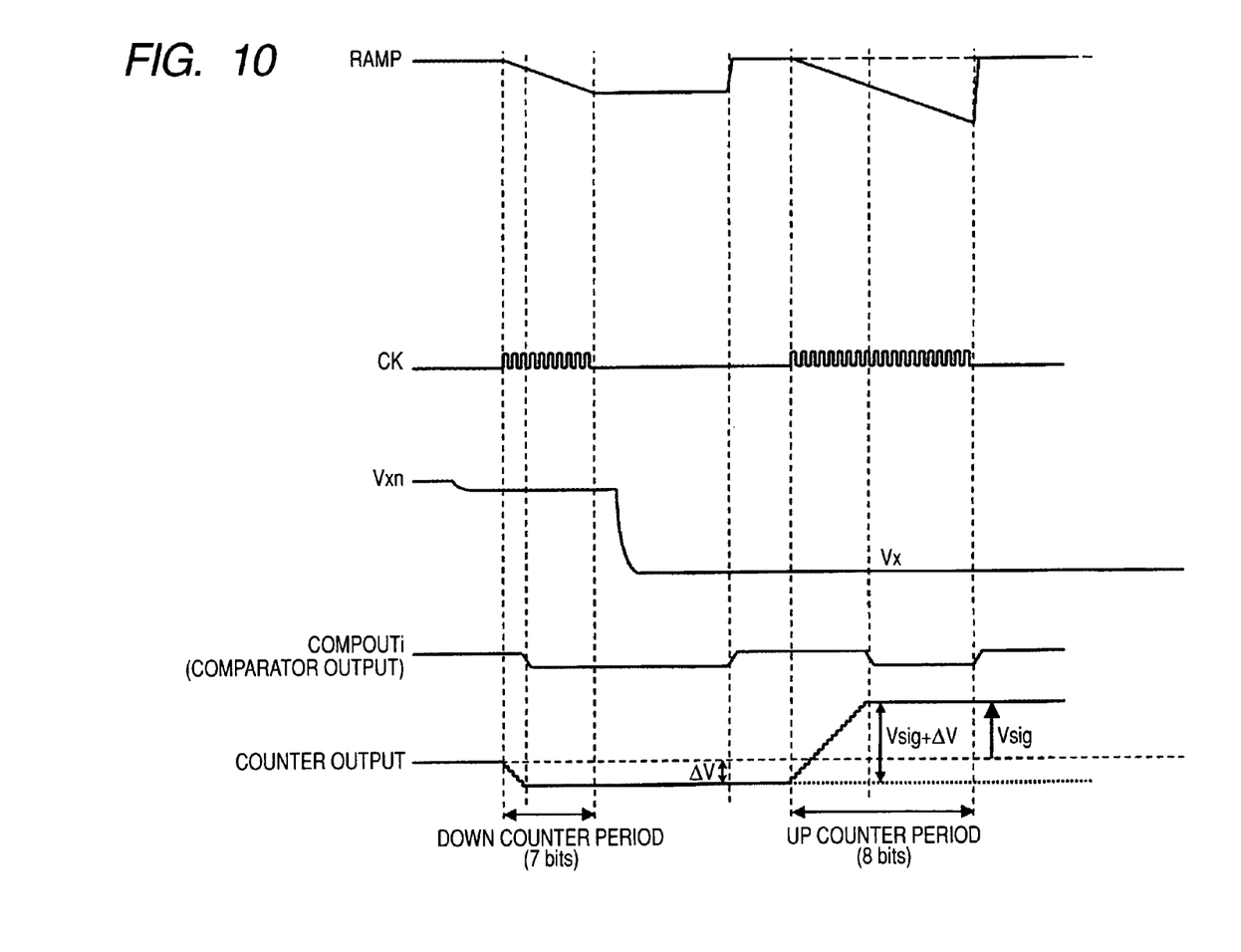
FIG. 10 is a timing chart for explaining operations by the solid-state imaging device in FIG. 3.

Next, in relation to the timing chart in FIG. 10 and the block diagram in FIG. 3, operations by the solid-state imaging device (CMOS image sensor) 10 according to this embodiment will be described.

After the first readout on the vertical lines V0, V1 and so on of the unit pixels 111 at an arbitrary row Hx becomes stable, the ramp waveform RAMP based on a reference voltage is output from the output of the DAC 16. The ramp waveform RAMP based on the reference voltage is input as a step-shaped waveform as a reference voltage REF for the comparators 151. Each of the comparators 151 compares the reference voltage and the voltage of an arbitrary vertical line Vx.

In this case, the counter latch 152 has a down counting state, and reset counting is performed therein. When the reference voltage REF and the voltage of Vx are equal, the output COMPOUTi of the comparator 151 is inverted. Then, the counter latch 152 stops the down counting operation and holds the count value.

In this case, the initial value of the counter latch 152 may be an arbitrary value of the levels of AD conversion, such as zero (0). During the reset counting period, the counter latch 152 reads out a reset component ΔV of the unit pixel 111.

Then, after the readout on the vertical lines V0, V1 and soon become stable according to the quantity of incident light, the ramp waveform RAMP in the data counting period is input as the reference voltage REF to the comparators 151, which then compare the reference voltage REF and the voltage of the arbitrary vertical lines V0, V1 and so on.

In parallel with the input of the step-shaped ramp waveform RAMP, the counter latches 152 perform up-counting. When the reference voltage REF and the voltage of Vx are equal, the output COMPOUTi of the comparator 151 is inverted, and the count corresponding to the comparison period is held.

The count value held in the counter latch 152 is scanned by the vertical scanning circuit 13 and is input as a digital signal to the sense amplifier circuit 17 through the data transfer line 154. Then, the digital values are sequentially detected and output.

As described above, this embodiment includes the pixel array section 11 having multiple pixels performing photoelectric conversion, which are laid out in a matrix form; at least one data transfer line 154 that transfers digital data; at least one data detecting circuit (sense amplifier circuit 17) that connects to the data transfer line 154; the multiple holding circuits 152 each of which holds the digital value corresponding to the analog input level read out through a vertical line of the pixel array section 11 and transfers the digital value and the vertical scanning circuit 13 that selects multiple holding circuits. The data transfer line 154 is laid out in the direction of wiring of a vertical line Vx, which is the vertical direction, and connects to the sense amplifier circuit 17 functioning as the data detecting circuit, which is laid out in the direction of the wiring of the vertical line Vx. Therefore, this embodiment provides following effects.

That is, the data transfer bus can be divided, which can reduce parasitic capacitance and/or parasitic resistance and therefore increase the speed of the data transfer.

The sense circuit, which functions as a first readout circuit further including a main sense circuit, can have a slower configuration, and the degree of freedom for increasing the speed of the drive section can be advantageously increased. This is because the circuit can be isolated from the asynchronous up/down counter, which is a digital circuit bringing about noise to the horizontal output line.

The solid-state imaging device having those effects is applicable to an imaging device for a digital camera and/or a video camera.

Figure 11:
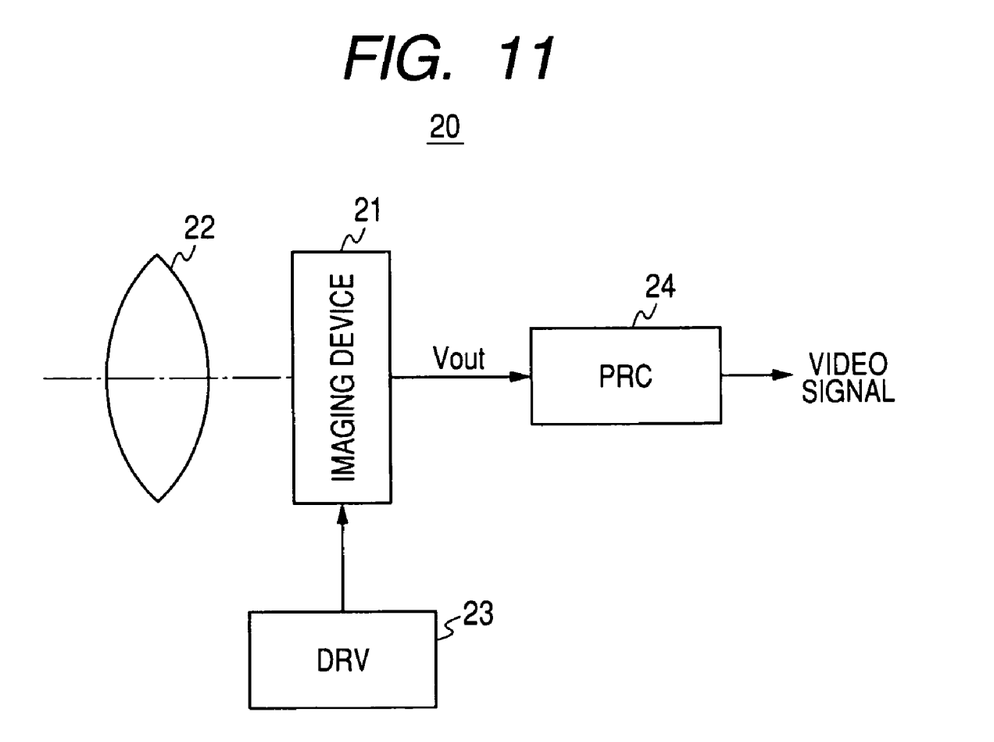
FIG. 11 is a diagram showing an example of the configuration of a camera system to which the solid-state imaging device according to an embodiment of the invention is applicable.

FIG. 11 is a diagram showing an example of the configuration of a camera system to which the solid-state imaging device according to an embodiment of the invention is applied.

A camera system 20, as shown in FIG. 11, includes an imaging device 21 to which the solid-state imaging device 10 according to the embodiment is applicable, an optical system that guides incident light to (or forms a subject image on) a pixel area of the imaging device 21, such as a lens 22 that forms incident light (image light) on an imaging plane, a driving circuit (DRV) 23 that drives the imaging device 21, and a signal processing circuit (PRC) 24 that processes an output signal of the imaging device 21.

The driving circuit 23 has a timing generator (not shown) that generates timing signals including a start pulse and a clock pulse, which drive circuits within the imaging device 21, and drives the imaging device 21 with a predetermined timing signal.

The signal processing circuit 24 performs signal processing such as CDS (Correlated Double Sampling) on an output signal of the imaging device 21.

The image signal processed in the signal processing circuit 24 is recorded on a recording medium such as a memory. The image information recorded on the recording medium is hard-copied by a printer, for example. The image signal processed in the signal processing circuit 24 is shown as moving pictures on a monitor including a liquid crystal display, for example.

As described above, a high-definition camera can be implemented by installing the imaging device 10 as the imaging device 21 into an imaging apparatus such as a digital still camera.

It should be understood by those skilled in the art that various modifications, combinations, sub-combinations and alterations may occur depending on design requirements and other factors insofar as they are within the scope of the appended claims or the equivalents thereof.

What is claimed is:

1. A data transfer circuit comprising:
   at least one transfer line transferring digital data;
   at least one data detecting circuit connecting to the at least one transfer line;
   multiple holding circuits holding a digital value corresponding to an input level; and
   a scanning circuit individually selecting the multiple holding circuits,
   wherein the multiple holding circuits are laid out in parallel; and
   the at least one transfer line is placed in a direction orthogonal to a direction of the parallel layout of the multiple holding circuits and connects to the data detecting circuit placed in the orthogonal direction and further comprising hierarchical buses for transferring image data, and each of the hierarchical buses transfers image data from a plurality of holding circuits of the multiple holding circuits via at least one data detecting circuit embodied as a sense amplifier such that a plurality of main sense amplifiers transmit signals out from each of the hierarchical buses.

2. The data transfer circuit according to claim 1, wherein multiple scanning circuits and transfer lines are grouped; and
   the at least one data detecting circuit is provided according to each of a plurality of groups.

3. The data transfer circuit according to claim 1, further comprising:
   a main transfer line connecting to an output of the at least one data detecting circuit; and
   a main data detecting circuit connecting to the main transfer line.

4. The data transfer circuit according to claim 2, further comprising:
   a main transfer line connecting to an output of the at least data detecting circuit; and
   a main data detecting circuit connecting to the main transfer line.

5. The data transfer circuit according to claim 3, wherein the main transfer line is placed in the direction of the parallel layout of the multiple holding circuits and connects to the main data detecting circuit.

6. The data transfer circuit according to claim 4, wherein the main transfer line is placed in the direction of the parallel layout of the multiple holding circuits and connects to the main data detecting circuit.

7. A solid-state imaging device comprising:
   an imaging section in which multiple pixels performing photoelectric conversion are laid out in a matrix;
   at least one transfer line transferring digital data;
   at least one data detecting circuit connecting to the at least one transfer line;
   multiple holding circuits holding a digital value corresponding to an input level; and a scanning circuit individually selecting the multiple holding circuits, wherein the multiple holding circuits are laid out in parallel; and the at least one transfer line is placed in a direction orthogonal to a direction of the parallel layout of the multiple holding circuits and connects to the data detecting circuit placed in the orthogonal direction and further comprising hierarchical buses for transferring image data, and each of the hierarchical buses transfers image data from a plurality of holding circuits of the multiple holding circuits via at least one data detecting circuit embodied as a sense amplifier such that a plurality of main sense amplifiers transmit signals out from each of the hierarchical buses.

8. The data transfer circuit according to claim 7, wherein multiple scanning circuits and transfer lines are grouped; and the at least one data detecting circuit is provided according to each of a plurality of groups.

9. The data transfer circuit according to claim 8, further comprising:

a main transfer line connecting to an output of the at least data detecting circuit; and a main data detecting circuit connecting to the main transfer line.

10. The data transfer circuit according to claim 9, wherein the main transfer line is placed in the direction of the parallel layout of the multiple holding circuits and connects to the main data detecting circuit.

11. A camera system comprising:

a solid-state imaging device;

an optical system forming a subject image on the imaging device; and a signal processing circuit processing an output image signal of the imaging device, the solid-state imaging device comprising an imaging section in which multiple pixels performing photoelectric conversion are laid out in a matrix, at least one transfer line transferring digital data;

at least one data detecting circuit connecting to the at least one transfer line;

multiple holding circuits holding a digital value corresponding to an input level; and a scanning circuit individually selecting the multiple holding circuits, wherein the multiple holding circuits are laid out in parallel; and the at least one transfer line is placed in a direction orthogonal to a direction of the parallel layout of the multiple holding circuits and connects to the data detecting circuit placed in the orthogonal direction and further comprising hierarchical buses for transferring image data, and each of the hierarchical buses transfers image data from a plurality of holding circuits of the multiple holding circuits via at least one data detecting circuit embodied as a sense amplifier such that a plurality of main sense amplifiers transmit signals out from each of the hierarchical buses.

12. The data transfer circuit according to claim 11, wherein multiple scanning circuits and transfer lines are grouped; and the at least one data detecting circuit is provided according to each of a plurality of groups.

13. The data transfer circuit according to claim 12, further comprising:

a main transfer line connecting to an output of the at least data detecting circuit; and a main data detecting circuit connecting to the main transfer line.

14. The data transfer circuit according to claim 13, wherein the main transfer line is placed in the direction of the parallel layout of the multiple holding circuits and connects to the main data detecting circuit.

* * * * *